(12) United States Patent
Dukkipati et al.

(10) Patent No.: US 8,696,864 B2
(45) Date of Patent: Apr. 15, 2014

(54) ROOM TEMPERATURE DEBONDING COMPOSITION, METHOD AND STACK

(71) Applicants: Promerus LLC, Brecksville, OH (US); Sumitomo Bakelite Co., Ltd., Tokyo (JP)

(72) Inventors: Venkat Dukkipati, Copley, OH (US); Kei Kawasaki, Tokyo (JP); Larry F. Rhodes, Silver Lake, OH (US); Toshihiro Sato, Tokyo (JP)

(73) Assignees: Promerus, LLC, Brecksville, OH (US); Sumitomo Bakelite Co., Ltd, Tokyo (JP)

( * ) Notice: Subject to any disclaimer, the term of this patent is extended or adjusted under 35 U.S.C. 154(b) by 0 days.

(21) Appl. No.: 13/749,754

(22) Filed: Jan. 25, 2013

(65) Prior Publication Data

US 2013/0192754 A1   Aug. 1, 2013

Related U.S. Application Data

(60) Provisional application No. 61/590,903, filed on Jan. 26, 2012.

(51) Int. Cl.
   *B32B 38/10* (2006.01)

(52) U.S. Cl.
   USPC ............... 156/719; 16/767; 16/930; 16/931; 16/932; 16/941

(58) Field of Classification Search
   None
   See application file for complete search history.

(56) References Cited

U.S. PATENT DOCUMENTS

| | | | |
|---|---|---|---|
| 4,489,154 A * | 12/1984 | Taylor, Jr. | 430/253 |
| 6,171,672 B1 * | 1/2001 | Koike et al. | 428/40.1 |
| 6,210,524 B1 * | 4/2001 | Josephy | 156/719 |
| 6,362,263 B1 * | 3/2002 | Brown et al. | 524/267 |
| 7,150,919 B2 * | 12/2006 | Ajbani et al. | 428/492 |
| 7,211,168 B2 | 5/2007 | Miyanari | |
| 7,482,249 B2 | 1/2009 | Jakob et al. | |
| 7,534,498 B2 | 5/2009 | Noda et al. | |
| 7,595,362 B2 * | 9/2009 | Kawabe et al. | 525/132 |
| 7,759,050 B2 | 7/2010 | Kessel et al. | |
| 7,988,807 B2 | 8/2011 | Noda et al. | |
| 8,038,839 B2 | 10/2011 | Noda et al. | |
| 8,361,375 B2 * | 1/2013 | Hidaka et al. | 264/338 |
| 8,366,873 B2 * | 2/2013 | George | 156/707 |
| 8,535,464 B2 * | 9/2013 | Lorence et al. | 156/84 |
| 2005/0173064 A1 | 8/2005 | Miyanari | |
| 2005/0208296 A1 * | 9/2005 | Saiki et al. | 428/343 |
| 2005/0233198 A1 * | 10/2005 | Nuzzo et al. | 429/34 |
| 2007/0062644 A1 | 3/2007 | Nakamura et al. | |
| 2007/0075308 A1 * | 4/2007 | Dotz et al. | 257/40 |
| 2007/0129502 A1 * | 6/2007 | Kawabe et al. | 525/391 |
| 2007/0151674 A1 | 7/2007 | Miyanari | |
| 2008/0152644 A1 * | 6/2008 | Song et al. | 424/130.1 |
| 2009/0020750 A1 * | 1/2009 | Doetz et al. | 257/40 |
| 2009/0107633 A1 * | 4/2009 | Yamaguchi et al. | 156/344 |
| 2009/0114908 A1 * | 5/2009 | Hirai et al. | 257/40 |
| 2009/0115075 A1 | 5/2009 | Kessel et al. | |

(Continued)

*Primary Examiner* — Mark A Osele
*Assistant Examiner* — Nickolas Harm
(74) *Attorney, Agent, or Firm* — Balaram Gupta

(57) ABSTRACT

Embodiments in accordance with the present invention provide for materials, methods for using such materials and structures that both incorporate such materials and are made using such methods that can be smoothly debonded at or near room temperature while providing a fixable bond that allows for wafer processing such as wafer thinning, anisotropic dry etching and chemical resistance during plating and etching.

3 Claims, 2 Drawing Sheets

(56) References Cited

U.S. PATENT DOCUMENTS

| | | | |
|---|---|---|---|
| 2009/0215209 A1* | 8/2009 | Anc et al. | 438/22 |
| 2009/0218560 A1 | 9/2009 | Flaim et al. | |
| 2010/0043608 A1 | 2/2010 | Jakob | |
| 2010/0203296 A1* | 8/2010 | Tsai et al. | 428/172 |
| 2010/0206479 A1 | 8/2010 | Pillalamarri et al. | |
| 2011/0068001 A1* | 3/2011 | Affinito et al. | 204/242 |
| 2011/0069467 A1 | 3/2011 | Flaim et al. | |
| 2011/0136321 A1 | 6/2011 | Kuroda et al. | |
| 2011/0146899 A1 | 6/2011 | Nakamura et al. | |
| 2011/0253314 A1* | 10/2011 | George | 156/706 |
| 2012/0283375 A1* | 11/2012 | Kageyama | 524/424 |

* cited by examiner

ROOM TEMPERATURE DEBONDING COMPOSITION, METHOD AND STACK

CROSS-REFERENCE TO RELATED APPLICATIONS

This application claims the benefit of priority to Provisional Patent Ser. No. 61/590,903 filed Jan. 26, 2012 the entire contents of which are incorporated herein by reference.

TECHNICAL FIELD

Embodiments in accordance with the present invention relate generally to temporary wafer bonding materials, methods and structures and more specifically to such materials, methods and structures that can bond a device wafer to a support substrate to allow for the processing of the device wafer and subsequently provide for the separation of the device wafer from the support substrate at or near room temperature.

BACKGROUND

As the use of semiconductor devices (also referred to as Integrated Circuits ((ICs) or chips) and modules, formed from a number of such devices, continues to increase, the complexity of such devices and modules is also increasing. In concert with this increased complexity is a requirement to make such devices smaller in both surface area and thickness and to make smaller modules that incorporate a plurality of such devices with this increased complexity.

It has been known for some time that to achieve the aforementioned requirement it is necessary to not only reduce surface area of such devices but to thin the device wafer from which such chips are obtained. Such thinning not only provides for dissipating heat generated by the operation of the chips, but also for enhancing their electrical performance and reducing the size of modules that incorporate such devices. Additionally, thinning can provide for the forming of through-silicon vias (TSVs) that provide electrical coupling locations on the backside of a chip thus allowing for a smaller surface area by moving front side contact areas to the chip's backside.

While there have been a number of proposed methods for thinning device wafers and performing the processing necessary to create TSVs, for the most part none of these methods have been able to provide for a laminated wafer stack that can simultaneously satisfy grinding force resistance, heat resistance during the anisotropic dry etching needed to form TSVs and chemical resistance during plating and etching, all while providing for smooth debonding of the lamination at or near room temperature.

Therefore it would be advantageous to develop materials, methods for using such materials and structures that incorporate such materials, such materials and methods including debonding a wafer from a substrate at or near room temperature while providing grinding force resistance during the back side grinding necessary for wafer thinning, heat resistance during the anisotropic dry etching needed to form TSVs and chemical resistance during plating and etching processes.

BRIEF DESCRIPTION OF THE DRAWINGS

Embodiments in accordance with the present invention are described herein with reference to the accompanying figures.

DETAILED DESCRIPTION

Figure 1:
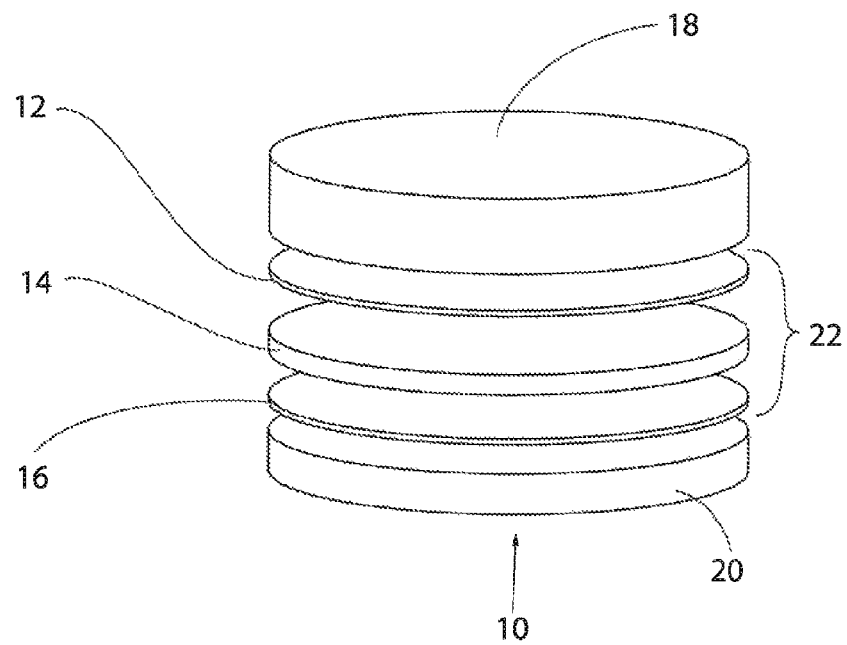
FIG. 1 is a schematic representation of wafer stack in accordance with embodiments of the present invention.

Exemplary embodiments in accordance with the present disclosure will be described with reference to the Examples and Claims provided hereinafter. Various modifications, adaptations or variations of such exemplary embodiments described herein may become apparent to those skilled in the art as such are disclosed. It will be understood that all such modifications, adaptations or variations that rely upon the teachings of the present invention, and through which these teachings have advanced the art, are considered to be within the scope of the present invention.

As used herein, the articles "a," "an," and "the" include plural referents unless otherwise expressly and unequivocally limited to one referent.

Since all numbers, values and/or expressions referring to quantities of ingredients, reaction conditions, etc., used herein and in the Exhibits and Claims appended hereto, are subject to the various uncertainties of measurement encountered in obtaining such values, unless otherwise indicated, all are to be understood as modified in all instances by the term "about."

As used herein, molecular weight values of polymers, such as weight average molecular weights ($M_w$) and number average molecular weights ($M_n$) are determined by gel permeation chromatography using polystyrene standards unless specified as being determined by another method.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined. That is to say that, unless otherwise indicated, all ranges disclosed herein are to be understood to encompass any and all subranges subsumed therein. For example, a stated range of from "1 to 10" should be considered to include any and all subranges between the minimum value of 1 and the maximum value of 10. Exemplary subranges of the range 1 to 10 include, but are not limited to, 1 to 6.1, 3.5 to 7.8, and 5.5 to 10. Further, where an integer range of from "0 to 12" is provided, it will also be considered to include any and all subranges as described above.

As used herein, the term "surface energy modifier material" (SEMM), will be understood to mean a material that alters the surface energy of a surface such that the surface can be releasably coated with an organic polymer. That is to say, the surface energy of such a surface is modified to both increase the hydrophobicity, and/or control the degree of the oleophobicity, of the surface. Further, such surface modification is believed to provide enhanced organic character to the surface to allow for coating with an organic polymer. Exemplary surface energy modifier materials include, but are not limited to, octadecyltrichlorosilane, octadecylmethoxydichlorosilane, octadecyltrimethoxysilane, dodecyitrimethoxysilane, dodecyldichloromethoxysilane, dodecyltrichlorosilane, polyether-modified polydimethylsiloxanes such as BYK®-333, BYK®-306 as well as other proprietary additives manufactured by BYK USA, Inc. Wallingford, Conn., that provide a strong reduction of surface tension, hydrogenated monohydroxy-terminated polybutadiene (HTPB, Sartomer USA, LLC Exton, Pa.) and (2-dodecen-1-yl) succinic anhydride (DSAD, Sigma Aldrich St. Louis, Mo.).

As used herein, the term "thermally stable polymer" (TSP) will be understood to mean an organic polymer that is thermo-oxidatively stable up to at least 300° C., thus exhibiting essentially no weight loss below 300° C. during a dynamic Thermogravimetric Analysis (TGA). Exemplary thermally stable polymers include, but are not limited to, styrene-hydrogenated isoprene-styrene polymers such as Septon 2002, styrene-hydrogenated butadiene-styrene polymers such as Septon 8004, Septon 8007, styrene-hydrogenated isoprene/butadiene-styrene polymers such as Septon 4033, all with 30 wt % styrene and <100K $M_W$ and manufactured by Kuraray Co., LTD., Japan; ethylene-propylene diene monomer (EPDM) polymer such as Keltan 27 and Keltan 314, with 5-8 wt % diene and 150-250K $M_W$, manufactured by Lanxess AG, Germany and appropriate polynorbornenes (PNB) having a glass transition temperature less than 300° C. and a weight average molecular weight between 75,000 and 150,000 Dalton, manufactured by Promerus LLC, Ohio, USA. Exemplary PNBs include, but are not limited to, DecylNB-AOAONB-TESNB 90:5:5 and DecylNB-AOAONB 90:10, where DecylNB is 5-decylbicyclo[2.2.1]hept-2-ene; AOAONB is 4,4'-(bicyclo[2.2.1]hept-5-en-2-ylmethylene)bis(2,6-di-tert-butylphenol) and TESNB is bicyclo[2.2.1]hept-5-en-2-yltriethoxysilane.

It will be understood that reference to "applying a surface energy modifier material" or that a "surface energy modifier material is applied to a surface", is inclusive of applying such a SEMM directly to such surface, as described below, as well as incorporating such a SEMM into an appropriate thermally stable polymer (TSP) where the SEMM can interact with a surface when such TSP is applied to such surface. Further it will be understood that the application of a TSP to a surface is further inclusive of the direct application of the TSP to a surface as well as any subsequent thermo-compression bonding used to form the debondable stack embodiments in accordance with the present invention.

As used herein, the term "debondable stack" or "debondable wafer stack" will be understood to mean a semiconductor device wafer laminated to a support substrate through a thermally stable polymer layer where a SEMM has been applied to a surface of one or both of the device wafer or support substrate. Such application of the SEMM being accomplished as described above.

It will be understood that reference to a "debonding force" means a force applied to a debondable stack that results in the smooth debonding of the lamination of such stack at or near room temperature. Further it will be understood that such force can be applied as a lateral force, that is a force applied to one of the device wafer or support substrate of such a stack in a direction that is essentially co-planar with the bonded surfaces thereof. Still further, it will be understood that such force can be applied as a wedging force at an interface between polymer layer and one of the device wafer or the support substrate. Further still, it will be understood that such force can be applied in a direction essentially perpendicular to the plane of such support structure. Where any one of such forces can be combined simultaneously or sequentially with any of the other forces to result in the aforementioned smooth debonding.

Embodiments in accordance with the present invention include a debondable stack that generally encompasses a semiconductor device wafer, an organic polymer layer and a support substrate (also referred to herein as a carrier substrate). While investigating how such a debondable stack having the aforementioned advantageous characteristics could be formed, the inventors realized that the use of a surface energy modifier material (SEMM) having a first structural portion that could interact/react with a device wafer surface and/or a support substrate surface and bond thereto, and having a second structural portion that could be oriented away from such surfaces and be available to interact with an organic, thermally stable polymer. The two structural portions, each having specific chemical reactivity thus allowing for such a polymer to form a fixable bond between the device wafer and the support substrate while allowing for such fixable bond to be released at or near room temperature by applying a debonding force to one of the device wafer or support substrate. It was further found that for some embodiments, such organic polymer layer can encompass one to four distinct polymer layers where each of such layers can be a single polymer or a blend of such polymers.

Thus it is believed that the use of such a SEMM will provide for the polymer layer to have a relatively strong bond to each of the device wafer and support substrate surfaces to which it is applied in a first direction, but will have a relatively weak bond to such surface in a second direction perpendicular to the first direction due to the low surface energy of the second portion of the SEMM on said treated surface. Since no chemical reaction occurs between polymer and low surface energy portion of the SEMM, separation of the polymer film from the wafer surface at room temperature using mechanical force is enabled, while at the same time the film adhesion is sufficiently strong to withstand wafer processing, such as wafer thinning, essentially without separation.

It is also believed that selecting appropriate TSPs and SEMMs is a function, at least in part, of the type of device wafer processing contemplated and the topography of the bonded surface of such wafer. That is to say that the polymers used to form any particular debondable wafer stack can be selected, for example, to be useful for absorbing or cushioning any physical forces, or other effects, that may result from such processing and/or selected to form an overcoat of the bonded wafer surface that mitigates the variation of such surface thus presenting a better surface for completion of the polymer stack that serves to fix the device wafer to the carrier substrate.

Turning now to FIG. 1, a schematic representation of a wafer stack 10 embodiment in accordance with the present invention is shown. Such a stack 10 encompasses a device wafer 20 and a carrier substrate 18 fixably bonded to one another through a polymer stack 22 having three distinct polymer layers, release layer 12, intermediate layer 14 and device layer 16. For release layer 12, either the surface of the carrier substrate 18 is first treated with a Surface Energy Modifier Material (SEMM) before layer 12 is formed thereon, or such SEMM is admixed with the polymer before being applied to substrate 18 to form release layer 12. Release layer 12, where such a three layer polymer stack is formed, is typically the thinnest of the layers and is typically 2 to 8 µm thick. With regard to device layer 16, such layer is typically 25 to 40 µm thick and provides at least partial planarization of the surface topography of device wafer 20, thus providing an essentially planar surface for bonding to bulk layer 14. Typically wafer 20 is not pretreated with an SEMM nor is an SEMM admixed with the polymer for forming layer 16 prior to it being applied to wafer 20. The polymer for forming layer 14 is typically 40 to 70 µm thick and like the polymer of layer 16, not admixed with an SEMM. While it has been described that layer 12 is applied to substrate 18 and layer 16 is applied to wafer 20, layer 14 can advantageously be applied overlying either of those layers and stack 10 formed by a thermo-compression bonding process after application of bulk layer 14. Such bonding being conducted at between 175 to 210° C. with a force of between 0.7 and 2 kN (a pressure of 22-63 kPa for an 8" wafer) applied for from 30 seconds to 3 minutes at a reduced atmospheric pressure of from 0.001 to 0.05 Torr, for example using a SUSS Microtec, SB-8e thermo-compression bonder. It will of course be understood that the various values provided above for thermo-compression bonding are a function of, at least, the specific polymers selected for the several above-described layers and both the total polymer stack thickness as well as the thickness of specific polymer layers thereof.

Figure 2:
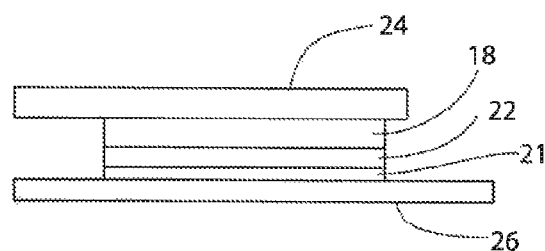
FIG. 2 is a schematic representation of wafer debonding method in accordance with embodiments of the present invention.
Figure 2:
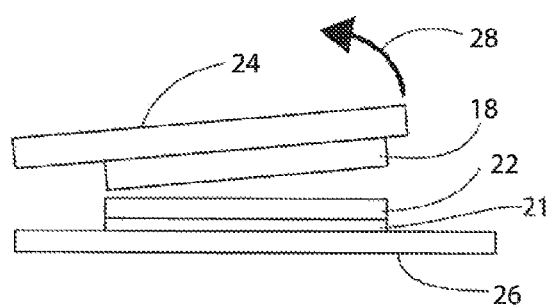

Turning now to FIG. 2, the plate chucking of a wafer stack for debonding is shown in the upper portion of the figure after wafer thinning. Thinned wafer 21 is shown at the bottom of the stack coupled to debonding chuck lower plate 26, typically using a wafer dicing tape (not shown). Polymer stack 22 is shown, for simplicity, as a single layer between thinned wafer 21 and carrier substrate 18. Carrier substrate 18 is shown coupled to debonding chuck upper plate 24, typically this coupling is by vacuum. In the lower portion of FIG. 2, force 28 is shown being applied to one side of upper plate 24 such that carrier substrate 18 is debonded from thinned wafer 21 leaving polymer stack 22 fixed to wafer 21. The application of force 28 in the manner shown is often referred to as a wedge-off debonding mechanism. While not depicted in FIG. 2, in some wedge-off debonding processes, or for manual debonding, it can be advantageous to insert a small wedge at the periphery of the interface of the carrier substrate 18 and polymer stack 22 before engaging the wedge-off mechanism or manual debonding. In addition, it should be understood that other debonding methods can be employed and that such other methods are within the scope of the present invention.

Figure 3A:
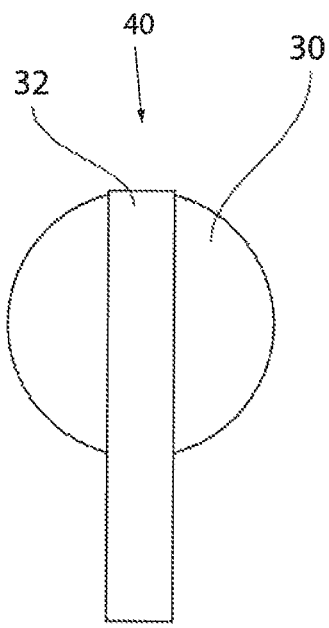
FIGS. 3a, 3b and 3c are schematic representations of a test method for the evaluation of room temperature debondable polymer and surface energy modifier materials (SEMM).
Figure 3B:
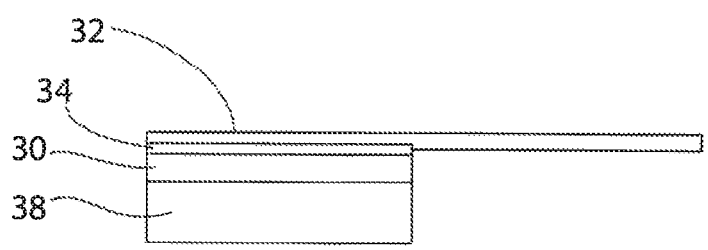
Figure 3C:
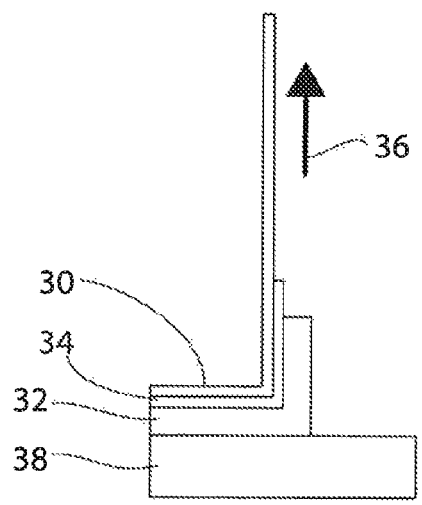

It should be noted that while actual testing of wafer substrate to carrier substrate bonding and debonding has been conducted both with and without performing any wafer processing before debonding, evaluation of various polymers and SEMMs has been more extensively evaluated using test structures. For example, turning now to FIG. 3A, test structure 40, encompassing test wafer 38 (not individually shown) having a polymer stack 22 (not individually shown) shown collectively as wafer stack 30, is depicted having polyimide strip 32 fixed to polymer stack 30 using double sided sticky tape (not shown). It has been found that a test structure consisting of a polymer coated silicon substrate and 25 mm wide double sided sticky tape coupled to both the polymer overlying the substrate and a polyimide strip is an effective method for measuring the 90 degree peel strength of the polymer's adherence to the silicon substrate. Referring to FIG. 3B, the aforementioned test structure is shown in cross-sectional view to clearly depict test wafer 38, polymer stack 22, double sided stick tape 34 and polyimide strip 32. Turning now to FIG. 3C, test structure 40 is shown with a portion of polymer stack 22 pulled free of test wafer 28 by the application of peeling force 36 to polyimide strip 32. The configuration shown is typically for an Orientec Tensilon RTC 1250A tester. Such tester generally is set to pull polyimide strip 32 at a rate of 50 mm per minute, at room, temperature, while measuring the force required to peel the polymer from the test wafer.

By using this testing method, it has been found that for some advantageous embodiments in accordance with the present invention, a 90 degree peel strength of from 2 N/m (0.05 N/25 mm) to 8 N/m (0.20 N/25 mm) indicates a polymer layer that can be smoothly debonded at or near room temperature. For other advantageous embodiments in accordance with the present invention, a 90 degree peel strength of from 2.8 N/m (0.07 N/25 mm) to 7.2 N/m (0.18 N/25 mm) have been found effective and for still other embodiments a 90 degree peel strength of from 4 N/m (0.10 N/25 mm) to 6 N/m (0.15 N/25 mm) are indicative of a polymer layer that can be smoothly debonded at or near room temperature.

It should be understood that the 90 degree peel strength test is used for screening the various thermally stable polymers and polymer compositions of embodiments in accordance with the present invention. It is believed that such screening is effective for identifying those polymers and polymer compositions that might be useful for forming room temperature debondable stack embodiments of the present invention. It will further be understood that once such polymer and polymer compositions are identified through the aforementioned screening, they are separately evaluated for actual effectivity by forming and testing actual wafer stacks that encompass such polymers and or polymer compositions. Such wafer stack evaluations encompassing (1) forming a potentially room temperature debondable stack and inspecting the quality of the substrate to substrate bonds that are formed; (2) processing the device wafer of such stack, for example performing wafer thinning, and again inspecting for defects; and (3) attempting to debond the device wafer and carrier substrate from one another at or near room temperature and if successful, inspecting the wafer for any defects that might have resulted from the debonding process. It should be further understood, that peeling polymer stack 22 (FIG. 3c) from a wafer, for example a thinned wafer such as thinned wafer 21 (FIG. 2) can be accomplished in a manner analogous to what is shown for the testing method depicted in FIGS. 3a-3c, and that such removal of polymer stack 22 is typically performed prior to singulation of the die that have been formed in thinned wafer 21.

Shown in Table 1 are some such results, As shown, the results obtained for a blend of Septon resins, designated as Septon E (2002/8007/8004 in a 65/33/2 w/w/w ratio), are provided as both a single polymer layer admixed with the indicated SEMM (in columns 1-6) and as a double layer where only a thin 3 μm layer of the polymer is admixed with the indicated SEMM, the remaining polymer layer not having admixed SEMM, (in columns 7-10) and in column 11, a single layer of a polynorbornene (DecylNB/AOAONB in a 90/10 molar ratio) admixed with the indicated SEMM. All thickness in Table 1 are in μm, SEMM concentration in pphr, peel strength in N/25 mm and N.D. stands for "Not Determined".

TABLE 1

|  | 1 | 2 | 3 | 4 | 5 | 6 | 7 | 8 | 9 | 10 | 11 |
|---|---|---|---|---|---|---|---|---|---|---|---|
| Type of Resin | Septon E[1] (single layer) | | | | | | Septon E[1] double layer (3 um with SEMM) | | | | PNB[2] |
| SEMM | | trichloro silane | | trimethoxy silane | | | BYK-333 | | | | Trichloro silane |

TABLE 1-continued

|  | 1 | 2 | 3 | 4 | 5 | 6 | 7 | 8 | 9 | 10 | 11 |
|---|---|---|---|---|---|---|---|---|---|---|---|
| chain[3] | $C_8$ | $C_{18}$ | $C_{12}$ | $C_{16}$ |  |  |  |  |  | $C_8$ |  |
| SEMM Concentration 90° peel strength | 7.14 | 7.14 | 7.14 | 7.14 | 0.76 | 1 | 2.8 | 4.2 | 5.6 | 14.7 | 2.3 |
| n1 | 0.06 | 0.18 | 2.07 | 0.34 | 0.05 | 0.05 | 0.08 | 0.08 | 0.06 | 0.10 | 0.17 |
| n2 |  | 0.11 | 1.20 | 1.56 | 0.05 |  | 0.13 |  |  | 0.10 | 0.18 |
| ave | 0.06 | 0.14 | 1.6 | 1.0 | 0.05 | 0.05 | 0.11 | 0.08 | 0.06 | 0.10 | 0.18 |
| Film thickness of peel test | 140 | 117 | 134 | 135 | 78 | 89 | 85 | 100 | 88 | 90 | 73 |
| Debondability[4] | Yes | Yes | No | No | Yes | Yes | Yes | Yes | Yes | Yes | Yes |
| Processability[4] | Fail | N.D | N.D | N.D | N.D | Fail | Pass | Pass | N.D | Pass | Pass |

[1] Septon E refers to a blend of Septon2002, Septon8007 and Septon8004 in a weight ratio of 35:60:5
[2] PNB refers to a polynorbornene having DecylNB and AOAONB repeat units in a molar ratio of 90:10
[3] Chain refers to the number of carbon atoms in the alkyl moiety of the silane SEMM, e.g. $C_8$ is 8 carbons
[4] Film thickness was 110 μm Thus it can be seen that where the 90 degree peel strength was higher than 0.20 N/25 mm (columns 3 and 4) the stack failed to debond, while for all of the other columns, debonding was possible. Further it can be seen that where the 90 degree peel strength was 0.06 N/25 mm or lower, for example in columns 1 and 6, processability of the device wafer failed. It is therefore shown that screening polymers and polymer compositions via a test is useful in predicting actual results.

EXPERIMENTAL

It will be understood that the development and evaluation of the materials encompassed in embodiments of the present invention were accomplished by inventors at Promerus, LLC in Brecksville, Ohio, USA and inventors at Sumitomo Bakelite Co. Ltd., having its headquarters in Tokyo, Japan. As a result of this collaboration, a variety of testing and processing equipment as well as methodology was employed. For example, where typically a Brewer Science CEE Model 100CB spinner was used at Promerus to apply polymer compositions to device wafers in the process of forming polymer layers, the equipment for polymer composition application at Sumitomo Bakelite was generally a SOKUDO Co. Ltd Model DSPIN80A. However, through the collaborative efforts of the inventors, the differences in the equipment utilized were overcome and the experimental data presented below made independent thereof. Thus where a polymer composition of Septon 2002 was applied by spin coating at Promerus with a Brewer Science CEE Model 100CB spinner to obtain a 40 μm polymer layer, the application of such a composition at Sumitomo Bakelite using a SOKUDO Co. Ltd Model DSPIN80A spinner was modified, if necessary, to produce the same film thickness.

As this collaboration was extensive, for clarity, in some of the experimental data presented below, process conditions may not be provided. Rather process results are provided with the understanding that process conditions can readily be found by one skilled in the art, for different equipment sets.

Evaluation of Wafer Pretreatment with OTCS

Unless specifically stated otherwise, where a surface energy modifier material (SEMM) was applied directly onto the center of a surface of a device wafer, or a surface of a support substrate, an appropriate amount of such SEMM was dispensed manually using a transfer pipette. After the dispense was completed, the spinner was started, brought to an appropriate speed and stopped after an appropriate amount, of time, where such appropriate speed and time was a speed and time sufficient to uniformly spread the SEMM. The wafer was then removed from the spinner and then first baked on a hot plate set at a temperature of 120° C. for 5 min and then moved to a second hot plate set at a temperature of 220° C. for an additional 5 min. Deionized (DI) water static contact angle of the several directly applied SEMMs was compared to that of a HMDS (hexamethyldisilazane) treated wafer and a native oxide coated wafer with no surface treatment. It was found, by visual observation, that the HMDS treated wafer and the native oxide wafer had approximate DI water contact angles of <50° and 45°, respectively, while a wafer treated with octadecyltrichlorosilane (OTCS, Sigma Aldrich) had a DI water static contact angle of >90°, which was taken as an indication that OTCS might be an excellent SEMM in view of its strong bonding to the wafer through the "trichlorosilane" portion (a first portion) of the molecule and its strong hydrocarbon character through its "octadecyl" portion (a second portion).

Wafer Bonding

To further test the effectivity of OTCS, a layer of Septon2002 was formed on an OTCS treated, a HMDS treated, and an untreated native oxide coated Si wafer. Each layer of Septon 2002 was approximately 40 μm thick. To each coated wafer, an uncoated glass wafer (carrier substrate) was then bonded using a SB-6e substrate bonder (Suss MicroTec) at a temperature of 180° C. with a pressure of 127 kPa applied for 5 minutes in a vacuum ($10^{-3}$ mbar). The bonded samples were visually inspected and found absent of any visible voids.

Wafer Debonding

To initiate wafer debonding of the above samples at room temperature, the sharp edge of a standard 012-HD type razor blade was manually inserted between bonded silicon and glass wafers. The degree of debondability was visually assessed by the length of delamination spread into the bonded wafer stack from the edge. The Septon2002 wafer bonded without any pretreatment or with HMDS pretreatment had no delamination, the wafers breaking during blade insertion. Septon2002 wafers bonded with OTCS pretreatment had some visible delamination after insertion of the blade and no breakage. The blade was then removed and the OTCS treated wafers were completely separated by hand starting from the already delaminated region. Following complete wafer separation, the Septon film remained on the glass wafer and could be manually peeled therefrom. Visual inspection of the glass showed that no polymer remained, indicating that there was no need for solvent cleaning for polymer removal. Another Septon2002 wafer pretreated with OTCS and bonded, as described above, to a glass wafer was heated on a hot plate set to a temperature of 280° C. for 30 min. The silicon and glass wafers were readily debonded leaving no residue on the silicon wafer. It is believed that this high temperature indicated the thermal stability of the OTCS treatment and the Septon2002 polymer.

Wafer Bonding—Debonding Experiments

Experiment 1

HTPB Treatment of Si Wafer

Approximately 1 mL of hydrogenated monohydroxy-terminated polybutadiene (HTPB) was dispensed using a transfer pipette (3 mL, Fischer Scientific) onto the center of a 4-inch silicon wafer center mounted on a CEE-spinner from Brewer Science. After dispensing, wafer rotation was ramped up at a rate of 1000 rpm/sec to 1000 rpm. After 30 s, wafer rotation was stopped and the wafer put on a hot plate (Wenesco HP01212) having its temperature set to 120° C. for 5 min followed by a hard bake on a hot plate (CEE 1300X, Brewer Science) set to 200° C. for 5 min.

Septos2002 Formulation

Septon2002 (Kuraray, Styrene hydrogenated isoprene Styrene Block Copolymer, styrene content: 30%) (40 g) was dissolved in mesitylene to generate a 40% solid content solution. The formulation was then filtered through a 6 μm filter (Pall, Type: HDCII, polypropylene).

Approximately 5 g of Septon2002 formulation was hand dispensed from the bottle onto the center of a 4-inch silicon wafer mounted on a CEE-spinner, CB-200X from Brewer Science. After dispense was completed, the wafer was ramped at a rate of 1000 rpm/s to 1200 rpm. After 30 s, wafer rotation was stopped and the wafer put onto a hot plate. (Wenesco HP01212) at 120° C. for 5 min to remove solvent and to provide a solid film. The film was then scratched manually with a blade to the wafer surface near the wafer center. Using a Veeco Dektak 150 profiler, a single thickness measurement was performed. The measured thickness was 40 μm.

Wafer Bonding and Thermal Stability

A 6-inch glass wafer was then bonded to the Septon2002 coated 4 inch wafer using a SB-6e substrate bonder (Suss MicroTec) at a temperature of 190° C. with a pressure of 2 KN applied for 5 minutes in vacuum ($10^{-3}$ mbar) to form a bonded wafer stack. Each sample bonded wafer stack was visually inspected and no voids were observed. Thermal stability was evaluated by placing a bonded wafer stack on to a hot plate (CEE 1300X, Brewer Science) set to 260° C. for 30 min, after which the wafer stack were visually inspected through the glass wafer, no voids were observed.

Wafer Debonding

A bonded wafer stack was fixed to a table top using a double side sticky tape (Tombow, Mono-adhesive, Type: permanent), the 4 inch wafer being at the bottom of the stack. Debonding was manually initiated by manually applying a wedge debonding force to an edge of the 6-inch glass wafer. Complete debonding was achieved for both the HTPB-treated wafer without breaking the glass wafer.

Experiment 2

The process of Si wafer treatment, polymer coating, bonded wafer stack formation, thermal stability analysis and Wafer debonding described in Experiment 1 was repeated except that the initial wafer treatment was with DASD as described below, DSAD Treatment of Si wafer Four grams of (2-dodecen-1-yl) succinic anhydride (DSAD) was dissolved in 6 g of mesitylene, and approximately 5 g of such solution was dispensed in the manner described for the HTPB treatment.

As was found for treatment with HHTP, polymer coating, bonded wafer stack formation, thermal stability and wafer debonding were ail successful.

Debonding Experiment 3

40 g of Septon2002, (Kuraray, Styrene hydrogenated isoprene Styrene Block Copolymer, styrene content: 30%) was dissolved in 60 g of mesitylene and then filtered through a 6 μm filter (Pall. Type: I-IDCII, polypropylene) to provide a solution having 40 wt % polymer.

Approximately 1 mL of octadecyltrichlorosilane (OTCS, Sigma Aldrich, product number: 104817-25G) was dispensed onto the center of a 4-inch silicon wafer mounted on a Brewer Science CEE-spinner. After dispense, the wafer was ramped at a rate of 1000 rpm/sec to 500 rpm for 30 sec, the rotation stopped and the wafer placed on a hot plate, set to 120° C., for 5 min followed by being placed on a second hot plate, set to 220° C., for an additional 5 min. After cooling to room temperature, the DI water static contact angle was determined by visual observation to be >90°.

5 g of the previously mentioned solution of Septon2002 was dispensed onto a wafer treated with OTCS, as described above, mounted on a Brewer Science CEE-spinner. After the dispense, the wafer was ramped at a rate of 1000 rpm/sec to 1200 rpm for 30 sec, the rotation stopped and the wafer placed on a hot plate, set to 120° C., for 5 min provide a solid Septon2002 film. Using a Veeco Dektak 150 profiler, a single thickness measurement was performed near the center of the wafer and the measured thickness found to be 40.2 μm.

A 6-inch glass wafer was then bonded to the Septon2002 and OTCS-treated Si wafer using a SB-6e substrate bonder (Suss MicroTec) at a temperature of 180° C. with a pressure of 127 kPa applied for 5 minutes in a vacuum ($10^{-3}$ mbar). The bonded samples were visually inspected and no voids were observed.

To initiate room temperature wafer debonding, a peeling force was applied to the edge of the 6-inch glass wafer in the following manner. The bonded wafers were glued to a table top with a 4-inch Si wafer on the bottom side using a double sided sticky tape (Tombow, Mono-adhesive, Type: permanent). Debonding was manually initiated by applying a force perpendicular to the plane of the wafer on the bottom-side near edge of the 6-inch glass wafer. Complete wafer separation was achieved with bonded wafers having OTCS treatments on either glass or Si wafers.

Debonding Experiment 4

A Septon2002 solution was prepared as described in Debonding Experiment 3.

To a portion of the above Septon2002 solution, 2.1 mL of octadecyltrichlorosilane OTCS was added and the mixture placed on a bench top roller (Wheaton brand) for uniform mixing over 24 hrs. No gelation was observed after mixing, indicating good uniformity of a 50,000 ppm OTCS, Septon2002 solution.

To another portion of the above Septon2002 solution, 1.0 mL of octadecyltrichlorosilane OTCS was added and the mixture placed on a bench top roller for uniform mixing over 24 hrs. No gelation was observed after mixing, indicating good uniformity of a 25,000 ppm OTCS, Septon2002 solution.

For each of the above solutions, approximately 5 g of the solution was dispensed onto a 4-inch Si wafer mounted on a Brewer Science CEE-spinner. After the dispense, each wafer was ramped to 500 rpm and held there for 5 sec and then ramped to 1200 rpm and held at that speed for 30 sec. After the spin cycle was complete, each wafer was placed on a hot plate, set to 120° C., for 5 min followed by being placed on a second hot plate, set to 200° C., for an additional 5 min to provide solid Septon2002 films. Using a Veeco Dektak 150 profiler, a single thickness measurement was performed for each wafer and the measured thicknesses found consistent, 40 μm, with the previously measured Septon2002 film.

The wafer having the 50,000 ppm OTCS Septon2002 film was bonded to a 4-inch glass wafer in the manner described above to form Stack 1. The bonded sample was visually inspected and no voids were observed. After bonding, thermal stability-test was performed at 220° C. and 260° C. each for 30 min on a hot plate (CEE 1300X from Brewer Science). The formulation was stable at both temperatures and no voids were observed.

The wafer having the 25,000 ppm OTCS Septon2002 film was bonded to a 6-inch silicon wafer in the manner described above to form Stack 2. The bonded sample was visually inspected and no voids were observed. After bonding, thermal stability was tested as described above. The formulation was stable at both temperatures and no voids were observed.

To initiate room temperature debonding of Stack 1, a standard 012-HD type razor blade was inserted in between the wafers to cause an initial debonding of at about 1 inch long. The bonded stack was then easily separated manually, the polymer film remaining on the glass wafer, from which it was readily peeled showing essentially no visible residue.

For Stack 2, the bonded wafers were glued to a table top with 4-inch Si wafer on bottom side using a double side sticky tape (Tombow, Mono-adhesive, Type: permanent). Debonding was manually initiated by manually applying a force perpendicular to the plane of the wafer on the bottom-side near edge of the 6-inch wafer. Complete debonding was achieved, after which the polymer film stuck to the 6-inch wafer but could be easily peeled off. Some white residues were observed on both the 4-inch and the 6-inch, but were easily removed by rinsing the wafers with mesitylene for 10 sec.

Thus it is seen that both pre-treatment of a wafer with a OTCS and admixing OTCS with a thermally stable polymer are effective for providing a debondable stack.

Debondable Wafer Stack (DWS) Example 5

A debondable wafer stack encompassing a single thermally stable polymer layer was formed. The TSP layer forming composition was a blend of 3 Septon polymers admixed with the SEMM, BYK333. The weight percent of the three polymers and the SEMM, the carrier solvent used, the weight % resin of the composition and its viscosity are provided in the table below. The TSP composition was applied to an 8 inch carrier substrate using a Sokudo Co. Ltd., DSPIN80A spin coater set with the following three part spin cycle 500 rpm/10 s+800 rpm/60 s+1500 rpm/2 s. After application of the TSP, the carrier substrate was heated for 2 minutes on a hot plate set to 140° C. to remove residual solvent. The thickness of the TSP layer was 40 μm. An 8 inch silicon wafer was then bonded to the coated carrier substrate using a SUSS Microtec SB-8e wafer bonder at a temperature of 190° C. with a force of 1 kN applied for 1 minute at a pressure of 0.01 Torr. The stack could be debonded at room temperature.

TSP Composition 1

| DWS Example 1 | |
|---|---|
| Septon2002 | 22.5 |
| Septon8004 | 0.7 |
| Septon8007 | 11.4 |
| BYK333 | 0.34 |
| Mesitylene | 65 |
| Weight % Resin | 35 |
| Viscosity [cup] | 7500 |

Debondable Wafer Stack (DWS) Example 6

A debondable wafer stack encompassing three thermally stable polymer layers was formed. Each of the three layers was a blend of Septon polymers where only the polymer composition designated as ASR2 was admixed with the SEMM, BYK333. The weight percent of the three polymers blended for each of the compositions, the weight % of the SEMM in composition ASR2 as well as the carrier solvent used, the weight % resin of the composition and its viscosity are provided in the table below. TSP compositions ASR2 and ASR3 were applied to an 8 inch carrier substrate using a Sokudo Co. Ltd., DSPIN80A spin coater. For ASR2 the coater spin cycle was 500 rpm/10 s+1500 rpm/30 s and for ASR 3, 500 rpm/10 s+750 rpm/60 s+1500 rpm/2 s. After each application the carrier substrate was heated for 2 minutes on a hot plate set to 140° C. to remove residual solvent. The TSP composition ASR1 was applied to an 8 inch silicon wafer using the aforementioned Sokudo Co. spin coater set to a spin cycle of 500 rpm/70 s and then heated as described for each of the other layers. The thickness of the three layers were ASR1 35 μm, ASR2 3 μm and ASR3 64 μm. The coated silicon wafer was then bonded to the coated carrier substrate as described in DWS Example 5 and found to be debondable at room temperature.

TSP Composition 2

| DWS Example 2 | ASR1 | ASR2 | ASR3 |
|---|---|---|---|
| Septon2002 | 20.0 | 12.5 | 23.4 |
| Septon8004 | 0.6 | 0.4 | 0.7 |
| Septon8007 | 10.2 | 6.4 | 11.9 |
| BYK333 | — | 0.7 | — |

-continued

| DWS Example 2 | ASR1 | ASR2 | ASR3 |
|---|---|---|---|
| Mesitylene | 69.2 | 80 | 64 |
| Weight % Resin | 30.8 | 20 | 36 |
| Viscosity [cP] | 2500 | 200 | 10000 |

Debondable Wafer Stack (DWS) Example 7

Another debondable wafer stack encompassing three thermally stable polymer layers was formed in the manner of DWS Example 2, except that the polymer compositions used were those provided below in the table entitled TSP Compositions 3. The thickness of the three layers were ASR1 35 μm, ASR2 3 μm and ASR3 64 μm. It should be noted that unlike the previous tables, the amount of BYK333 is expressed as "pphr", parts per hundred resin. As for DWS Example 5 and 6, the stack of this example was found to be debondable at room temperature.

TSP Composition 3

| DWS Example 3 | ASR1 | ASR2 | ASR3 |
|---|---|---|---|
| Septon2002 | 65.0 | 65.0 | 65.0 |
| Septon8004 | 2.0 | 2.0 | 2.0 |
| Septon8007 | 33.0 | 33.0 | 33.0 |
| BYK333 (pphr) | — | 2.56 | — |
| Mesitylene | 224.7 | 410.3 | 177.8 |
| Weight % Resin | 30.8 | 20 | 36 |
| Viscosity [cP] | 2500 | 200 | 10000 |

Debondable Wafer Stack (DWS) Example 8

A debondable wafer stack encompassing two thermally stable polymer layers was formed in the manner of DWS Example 6, except that the polymer compositions used were those provided below in the table entitled TSP Compositions 4. Each of the two layers was a blend of Septon polymers where only the polymer composition designated as ASR2 was admixed with the SEMM, BYK333. As in the other DWS Examples, the weight percent of the three polymers blended for each composition, the weight % of the SEMM in composition ASR2 as well as the carrier solvent used, the weight % resin of the composition and its viscosity are provided in the table below. TSP compositions ASR2 and ASR1 were applied to an 8 inch carrier substrate and a silicon wafer, respectively. The coating program for ASR2 was as described for DWS Example 7 and the coating program for ASR1 was 500 rpm/10 s+330 rpm/60 s. After coating, each of the silicon wafer and carrier substrate was heated as described for DWS Example 7. The thickness of the two layers were ASR1 99 μm and ASR2 3 μm. The coated silicon wafer was then bonded to the coated carrier substrate as described in DWS Example 5 and found to be debondable at room temperature. As for DWS Example 5, 6 and 7, the stack of this example was found to be debondable at room temperature.

TSF Composition 4

| DWS Example 4 | ASR1 | ASR2 |
|---|---|---|
| Septon2002 | 65.0 | 65.0 |
| Septon8004 | 2.0 | 2.0 |
| Septon8007 | 33.0 | 33.0 |
| BYK333 (pphr) | — | 2.56 |
| Mesitylene | 224.7 | 410.3 |
| Weight % Resin | 30.8 | 20 |
| Viscosity [cP] | 2500 | 200 |

Wafer Peel Type Debonding, Septon2002/HTPB Mixtures Example 9

Two formulations of Septon2002 and HTPB were prepared as described below. For the first formulation, 0.4 g of HTPB was added to 40 g of Septon2002 using a micro-syringe (B-D® 5 cc with Luer-Lok®). The mixture was then placed on a bench top roller (Wheaton brand) for uniform mixing over 24 hrs to form a 2.5 pphr mixture of Septon2002 and HTPB. No gelation was observed after mixing, indicating good uniformity. For the second formulation, 0.8 g of HTPB was added to 40 g of Septon2002 using a micro-syringe and mixed in the same manner as the first formulation to form a 5.0 pphr mixture of Septon2002 and HTPB.

Wafer Coating and Thickness Measurement

For each of the 2.5 pphr and 5.0 pphr formulations, approximately 5 g of each formulation was hand dispensed onto the center of a 4-inch Si wafer, and spin coated to form an approximately 40 μm thick film in the manner described previously.

Peel Tests

Peel tests were performed to assess, qualitatively, the adhesion strength of the formulations. Peeling was conducted by vertically pulling each film upwards and off the wafer; both formulations were found to peel off easily.

Wafer Bonding

Samples of both formulations were coated onto blank Si wafers, as described above, to provide films approximately 40 μm thick. A 6-inch glass wafer was then bonded to each of the coated wafers using a SB-6e substrate bonder (Suss Micro-Tec) at a temperature of 190° C. with a pressure of 2 KN applied for 5 minutes in a vacuum ($10^{-3}$ mbar). After bonding, each of the samples was visually inspected and no voids were observed.

Thermal Stability Tests of Bonded Wafer

Bonded samples of both formulations were put on a hot plate (CEE 1300X, Brewer Science) set to 260° C. for 30 min. Each sample was removed from the hot plate and visually inspected through the glass wafer, no voids were observed.

Wafer Debonding

Samples of both formulations were manually debonded as described in Example 1. The sample having the 2.5 pphr formulation could not be debonded, rather the glass wafer broke. The sample having the 5.0 pphr formulation was completely debonded. Thus it is believed that unlike a 5.0 pphr formulation, a 2.5 pphr formulation is insufficient for providing a debondable stack. Thus it is believed that formulations of Septon2002 having greater than 2.5 pphr of HTPB admixed therein, can be useful for room temperature debonding.

Wafer Peel Type Debonding, Septon2002/DSAD Mixtures Example 10

The process of Si wafer treatment, polymer coating, bonded wafer stack formation, thermal stability analysis and wafer debonding described in Experiment 9 was repeated except that 2.5 pphr and 5.0 pphr formulations of Septon2002 with DSAD were employed.

Thermal Stability Tests of Bonded Wafer

Unlike the formulations of Example 9, both the 2.5 pphr and the 5.0 pphr formulation exhibits voids after the glass-Si wafer stacks were heated for 30 minutes on a hot plate set to 260° C. The 2.5 pphr formulation had fewer visible voids than the 5.0 pphr formulation.

Wafer Debonding

As was found for the Si-glass wafer pairs of Example 9, both bonded stacks were debonded without breaking the glass wafers. However, due to the visible voids formed during thermal stability testing, formulations of Septon2002 having 2.5 pphr or greater DSAD appear not to be useful where temperatures as high as 260° C. can be encountered.

By now it should be realized that debondable wafer stack embodiments in accordance with the present invention have been described hereinabove. Further it has been demonstrated that such stacks can withstand wafer processing such as wafer thinning, and that such stacks can be debonded at or near room temperature.

The invention claimed is:
1. A debonding method, comprising:
providing a wafer stack comprising;
    a semiconductor substrate having a device surface;
    a support substrate having a bondable surface, where one or both of said device surface and said bondable surface comprise a surface energy modifier material selected from octadecyltrichlorosilane, octadecyltrimethoxysilane, (2-dodecen-1-yl) succinic anhydride, a hydrogenated monohydroxy-terminated polybutadiene, or a polyether-modified polydimethylsiloxane; and
    a thermally stable polymer layer bonded to the bondable surface and the device surface, where said polymer layer comprises at least one of a styrene-hydrogenated isoprene-styrene polymer, a styrene-hydrogenated butadiene-styrene polymer, a styrene-hydrogenated isoprene/butadiene-styrene polymer or a polynorbornene polymer, where such styrene-hydrogenated polymers are at least 30 wt % styrene and have a weight average molecular weight of less than 100,000 Dalton and where such polynorbornene polymer has a glass transition temperature of 300° C. or less;
applying a debonding force to said support substrate at room temperature, to separate said semiconductor substrate from said support substrate; and
wherein said surface energy modifier material is present at an amount greater than 2.5 parts per hundred parts of said thermally stable polymer.

2. The temporary bonding method of claim 1 where said polymer layer can further comprise an ethylene-propylene diene monomer (EPDM) polymer having 5-8% diene and a weight average molecular weight of from 150,000 to 250,000 Dalton.

3. A temporary bonding method, comprising:
providing a debondable stack comprising;
    a semiconductor substrate having a device surface;
    a support substrate having a bondable surface; and
    a polymer layer disposed over one or both of the bonding surface and the device surface; said polymer layer comprising a surface energy modifier selected from octadecyltrichlorosilane, octadecyltrimethoxysilane, a hydrogenated monohydroxy-terminated polybutadiene, or a polyether-modified polydimethylsiloxane, one of a styrene-hydrogenated isoprene-styrene polymer, a styrene-hydrogenated butadiene-styrene polymer, a styrene-hydrogenated isoprene/butadiene-styrene polymer or a polynorbornene, where such styrene-hydrogenated polymers are at least 30 wt % styrene and have a weight average molecular weight of less than 100,000 Dalton, such polynorbornene has a glass transition temperature of 300° C. or less with the proviso that when the polymer is a polynorbornene the surface energy modifier is not a polyether modified polydimethylsiloxane;
applying a debonding force to said semiconductor substrate at room temperature, to separate said semiconductor substrate from said support substrate; and,
wherein said surface energy modifier material is present at an amount greater than 2.5 parts per hundred parts of said thermally stable polymer.

* * * * *